(12) United States Patent
Yuasa

(10) Patent No.: US 11,631,569 B2
(45) Date of Patent: Apr. 18, 2023

(54) CHARGED PARTICLE BEAM SYSTEM

(71) Applicant: JEOL Ltd., Tokyo (JP)

(72) Inventor: Shuichi Yuasa, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 17/570,749

(22) Filed: Jan. 7, 2022

(65) Prior Publication Data

US 2022/0223371 A1 Jul. 14, 2022

(30) Foreign Application Priority Data

Jan. 8, 2021 (JP) .............................. JP2021-002167

(51) Int. Cl.
*H01J 37/26* (2006.01)
*H01J 37/18* (2006.01)
*H01J 37/20* (2006.01)

(52) U.S. Cl.
CPC ............ *H01J 37/261* (2013.01); *H01J 37/18* (2013.01); *H01J 37/20* (2013.01);
(Continued)

(58) Field of Classification Search
CPC .......... H01J 37/18; H01J 37/20; H01J 37/185; H01J 37/261; H01J 2237/26;
(Continued)

(56) References Cited

U.S. PATENT DOCUMENTS

| | | | |
|---|---|---|---|
| 2006/0022135 A1* | 2/2006 | Moore | H01J 37/20 250/309 |
| 2015/0137000 A1 | 5/2015 | Naruse | |
| 2017/0133197 A1 | 5/2017 | Kawai | |

FOREIGN PATENT DOCUMENTS

| | | |
|---|---|---|
| EP | 3038131 A1 | 6/2016 |
| JP | H0817381 A | 1/1996 |

(Continued)

OTHER PUBLICATIONS

Extended European Search Report issued in EP21217690.3 dated May 30, 2022.
(Continued)

*Primary Examiner* — David E Smith
*Assistant Examiner* — Hsien C Tsai
(74) *Attorney, Agent, or Firm* — The Webb Law Firm

(57) ABSTRACT

Provided is a charged particle beam system capable of reducing the force applied to a sample when a chuck device grips the sample. The charged particle beam system is typified by an electron microscope including a sample chamber, a sample exchange chamber connected to the sample chamber, a sample container capable of being removably attached in the sample exchange chamber, and a transport device for transporting the sample between the sample container and the sample exchange chamber. The transport device includes the chuck device for gripping the sample, a drive mechanism for moving the chuck device in a given direction, a mechanical driver for actuating the chuck device, and a power transmission mechanism for transmitting power of the mechanical driver to the chuck device. The power transmission mechanism includes a shaft and a resilient member that elastically deforms when a force in the given direction is applied to the shaft.

5 Claims, 12 Drawing Sheets

(52) U.S. Cl.
   CPC . *H01J 2237/204* (2013.01); *H01J 2237/2006* (2013.01); *H01J 2237/2007* (2013.01)
(58) Field of Classification Search
   CPC ........... H01J 2237/002; H01J 2237/184; H01J 2237/204; H01J 2237/2002; H01J 2237/2006; H01J 2237/2007; H01J 2237/2602
   See application file for complete search history.

(56) References Cited

FOREIGN PATENT DOCUMENTS

| | | |
|---|---|---|
| JP | H11185686 A | 7/1999 |
| JP | 2002365182 A | 12/2002 |
| JP | 201588237 A | 5/2015 |
| KR | 20010039900 A * | 5/2001 |

OTHER PUBLICATIONS

Office Action issued in JP2021002167 dated Dec. 20, 2022.
Office Action issued in JP2021002165 dated Dec. 20, 2022.

* cited by examiner

CHARGED PARTICLE BEAM SYSTEM

CROSS-REFERENCE TO RELATED APPLICATION

This application claims priority to Japanese Patent Application No. 2021-002167, filed Jan. 8, 2021, the disclosure of which is hereby incorporated by reference in its entirety.

BACKGROUND OF THE INVENTION

1. Field of the Invention

The present invention relates to a charged particle beam system.

2. Description of the Related Art

In the field of charged particle beam systems including transmission electron microscopes, it is known to use an automated transport device for automatically conveying a cartridge, which holds a sample therein, into a sample chamber.

For example, JP-A-2015-88237 discloses a charged particle beam system equipped with a first transport rod and a second transport rod. The first transport rod transports a magazine having a cartridge loaded therein between a sample container and a sample exchange chamber. The second transport rod transports the cartridge between the sample exchange chamber and a sample chamber.

In the charged particle beam system of JP-A-2015-88237, when the first transport rod grips the magazine received in the sample container in the space between the sample container and the sample exchange chamber, the magazine is pushed by the first transport rod and thus a force is applied to the sample container. This may create a gap in the interface between the sample container and the sample exchange chamber, causing inflow of air into the sample container.

SUMMARY OF THE INVENTION

One aspect of the charged particle beam system associated with the present invention includes a sample chamber, a sample exchange chamber connected to the sample chamber, a sample container capable of being removably attached in the sample exchange chamber, and a transport device for transporting a sample between the sample container and the sample exchange chamber. The transport device includes a chuck device for gripping the sample, a drive mechanism for moving the chuck device in a given direction, a mechanical driver for actuating the chuck device, and a power transmission mechanism for transmitting power of the mechanical driver to the chuck device. The power transmission mechanism includes a shaft and a resilient member that elastically deforms when a force in the given direction is applied to the shaft.

Since this charged particle beam system includes the resilient member which elastically deforms when a force in the direction to move the chuck device is applied to the shaft, the force applied to the sample can be reduced when the chuck device grips the sample. Therefore, when the chuck device grips the sample, the force applied to the sample container via the sample can be decreased. Consequently, entry of the atmosphere into the sample container can be prevented.

DESCRIPTION OF THE INVENTION

The preferred embodiments of the present invention are hereinafter described in detail with reference to the accompanying drawings. It is to be understood that the embodiments provided below are not intended to unduly restrict the contents of the present invention delineated by the claims and that not all the configurations set forth below are the essential constituent components of the invention.

In the following, an electron microscope using an electron beam is set forth as one example of a charged particle beam system associated with the present invention. The charged particle beam system associated with the present invention may also be an instrument using a charged particle beam other than an electron beam such as an ion beam.

1. Electron Microscope
1.1. Configuration of Electron Microscope

Figure 1:
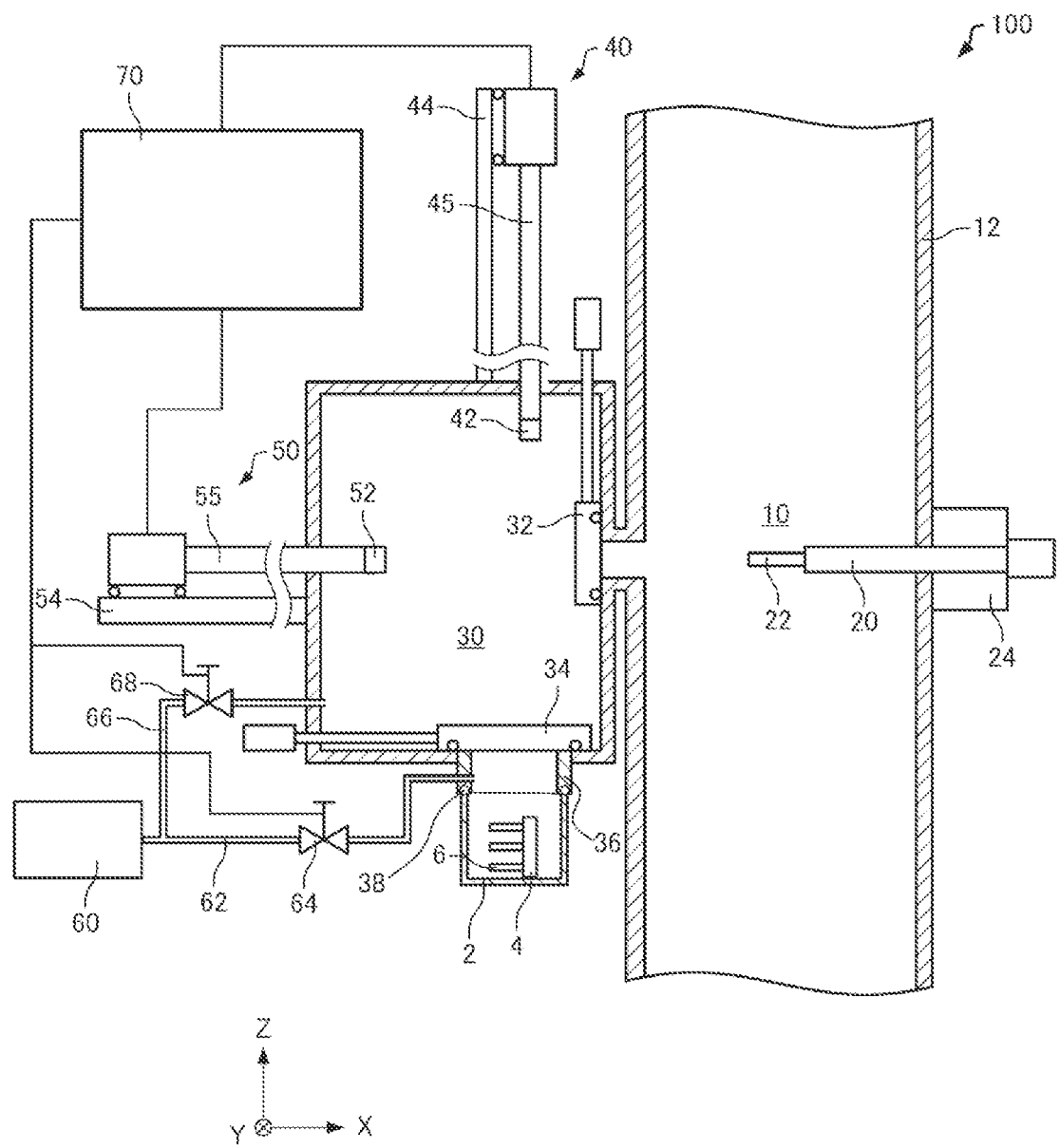
FIG. 1 is a diagram showing the configuration of an electron microscope associated with one embodiment of the present invention.

An electron microscope associated with one embodiment of the present invention is first described by referring to FIG. 1, which shows the configuration of this electron microscope, 100. In FIG. 1, X-, Y-, and Z-axes are shown as three mutually perpendicular axes. In FIG. 1, the Z-axis extends in an up/down direction.

As shown in FIG. 1, the electron microscope 100 includes a sample container 2, a sample chamber 10, a sample holder 20, a sample exchange chamber 30, a first transport device 40, a second transport device 50, vacuum pumping equipment 60, and a controller 70. The electron microscope 100 is a transmission electron microscope, for example.

The sample chamber 10 is formed in an electron optical column 12. An electron source for emitting an electron beam, an illumination optical system, and an imaging system (none of which are shown) are housed in the electron optical column 12. The electron beam emitted from the electron source is directed at a sample by the illumination optical system. The imaging system creates a focused TEM image from the electron beam transmitted through the sample. The electron microscope 100 is also equipped with a detector for detecting the image focused by the imaging system and a detector for detecting X-rays released from the sample in a manner not illustrated.

The sample chamber 10 includes the space between top and bottom polepieces of an objective lens (not shown). The sample chamber 10 is evacuated to a vacuum by vacuum pumping equipment. The sample holder 20 has a mounting portion 22 which is disposed in the sample chamber 10. A cartridge 6 is mounted to the mounting portion 22.

The sample holder 20 is placed in position by a goniometer stage 24 capable of tilting a sample held in the sample holder 20. In the electron microscope 100, the sample can be tilted relative to two mutually perpendicular axes, for example.

The sample holder 20 has the mounting portion 22 to which the cartridge 6 is mounted as mentioned previously. The sample is held in the cartridge 6. Because the cartridge 6 is mounted to the mounting portion 22, the sample can be observed in the electron microscope 100.

The sample exchange chamber 30 is coupled to the sample chamber 10. A partition valve 32 is mounted between the sample exchange chamber 30 and the sample chamber 10. The sample container 2 is connected into the sample exchange chamber 30 via a connective member 36 in the illustrated example. The sample container 2 can be mounted to and detached from the connective member 36. Another partition valve 34 is mounted between the sample exchange chamber 30 and the sample container 2. The sample exchange chamber 30 and the sample container 2 are evacuated to a vacuum by the vacuum pumping equipment 60.

When the sample container 2 is connected to the connective member 36, a vacuum seal 38 is placed between the connective member 36 and the sample container 2. The vacuum seal 38 is an O-ring, for example. When the sample container 2 is coupled into the sample exchange chamber 30, the vacuum seal 38 makes it possible to make the interiors of the sample exchange chamber 30 and sample container 2 airtight.

The sample container 2 is used to receive a sample. In the illustrated example, a magazine 4 is received in the sample container 2. A plurality of cartridges 6 can be loaded in the magazine 4. A case is now presented in which the magazine 4 having the cartridges 6 loaded therein is received in the sample container 2. Alternatively, the cartridges 6 may be directly received into the sample container 2.

The first transport device 40 transports a selected one of the cartridges 6 between the sample container 2 and the sample exchange chamber 30, i.e., transports the sample between the sample container 2 and the sample exchange chamber 30. In this example, the first transport device 40 transports the cartridge 6 by conveying the magazine 4.

The first transport device 40 has a chuck device 42 and a drive mechanism 44 for moving the chuck device 42. The chuck device 42 grips the sample directly or indirectly. In some cases, the chuck device 42 may directly grip the sample. Where the sample is attached to other member, the chuck device 42 may grip this other member. In this example, the sample is attached to the cartridge 6 which in turn is loaded in the magazine 4. The chuck device 42 grips the magazine 4.

The drive mechanism 44 moves the chuck device 42 along the Z-axis, i.e., in the +Z and −Z directions, by moving a rod 45 having a front end to which the chuck device 42 is mounted, using power from an electric motor or an air cylinder. The second transport device 50 transports the cartridge 6 between the sample exchange chamber 30 and the sample chamber 10, i.e., carries the sample between these two chambers 30 and 10.

The second transport device 50 takes out the cartridge 6 from within the magazine 4 gripped by the first transport device 40. The second transport device 50 then carries the extracted cartridge 6 from the sample exchange chamber 30 to the sample chamber 10 and mounts the cartridge 6 to the mounting portion 22.

The second transport device 50 has a chuck device 52 and a drive mechanism 54 for moving the chuck device 52. The chuck device 52 grips the cartridge 6. The drive mechanism 54 moves the chuck device 52 along the X-axis, i.e., in +X and −X directions, by moving a rod 55 having a front end to which the chuck device 52 is mounted, using power from an electric motor or an air cylinder.

The vacuum pumping equipment 60 evacuates the sample container 2 to a vacuum via an exhaust tube 62. A solenoid valve 64 is mounted in the exhaust tube 62. The vacuum pumping equipment 60 also evacuates the sample exchange chamber 30 to a vacuum via an exhaust tube 66. A solenoid valve 68 is mounted in the exhaust tube 66. The sample exchange chamber 30 is maintained in a vacuum by evacuating the chamber by means of the vacuum pumping equipment 60.

The controller 70 controls the partition valves 32, 34, first transport device 40, second transport device 50, and solenoid valves 64, 68. For example, the controller 70 includes a CPU (central processing unit) and storage devices such as a RAM (random access memory) and a ROM (read only memory). The controller 70 performs various kinds of control operations by executing programs stored in the storage devices with the CPU.

1.2. First Transport Device

Figure 2:
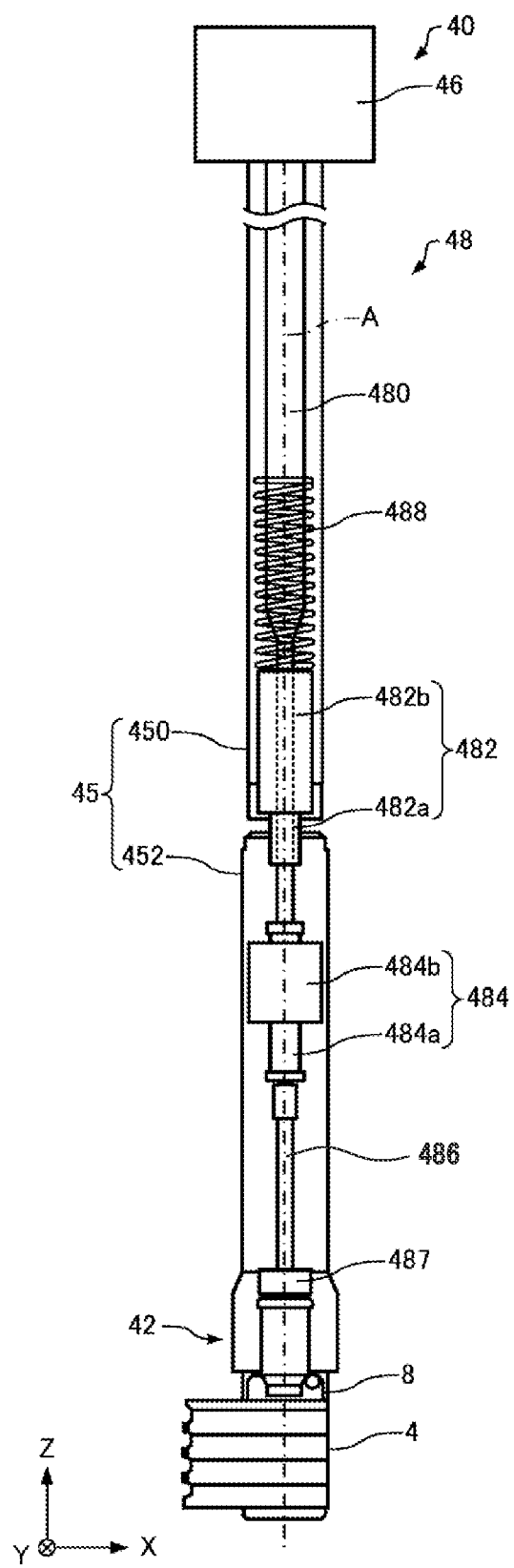
FIG. 2 illustrates a first transport device.

FIG. 2 illustrates the first transport device 40 which includes the chuck device 42, a mechanical driver 46, and a power transmission mechanism 48, as shown. The mechanical driver 46 includes a rotary air cylinder, for example, and produces a rotary force using pneumatic pressure. Alternatively, the mechanical driver 46 may use an electric motor to produce the rotary force. The power generated by the mechanical driver 46 is transmitted to the chuck device 42 via the power transmission mechanism 48, thus actuating the chuck device 42. In particular, the chuck device 42 can grip and release the magazine 4 using the power of the mechanical driver 46. The mechanical driver 46 is disposed outside the sample exchange chamber 30. This can prevent the degree of vacuum in the sample exchange chamber 30 from decreasing, i.e., prevent the internal pressure from rising.

The power transmission mechanism 48 includes a first shaft 480, a ball spline 482, a ball screw 484, a second shaft 486, and a resilient member 488 all of which are incorporated within the rod 45. The rod 45 is separated into a first portion 450 and a second portion 452. The first shaft 480, the bearing 482b of the ball spline 482, and the resilient member 488 are received in the first portion 450. The ball screw 484 and the second shaft 486 are received in the second portion 452. The ball spline 482 has a splined shaft 482a to which the second portion 452 is connected.

The first shaft 480 is coupled to the mechanical driver 46 and rotated by the rotary force generated by the mechanical driver 46. The ball screw 484 has a threaded shaft 484a to which the first shaft 480 is coupled. The first shaft 480 transmits the rotary motion of the mechanical driver 46 to the ball screw 484.

Figure 3:
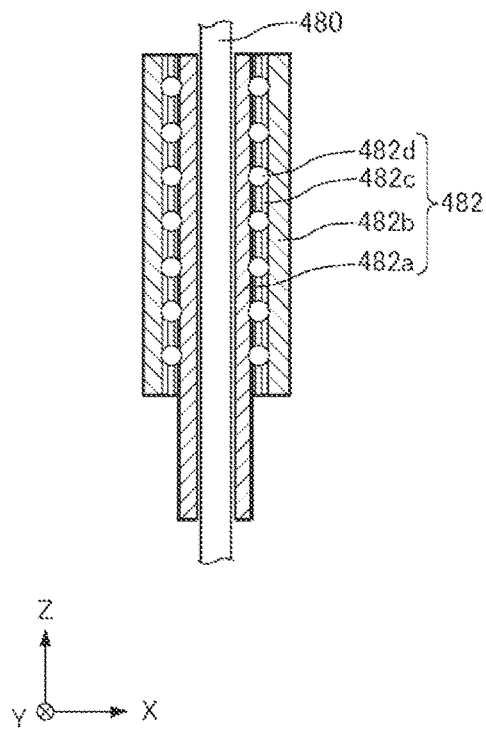
FIG. 3 is a schematic cross-sectional view of a ball spline.

FIG. 3 is a schematic cross-sectional view of the ball spline 482. The ball spline 482 includes the splined shaft 482a, the bearing 482b, and a retainer 482c. The retainer 482c holds a plurality of balls 482d therein. In the ball spline 482, the balls 482d are interposed between grooves respectively formed in the splined shaft 482a and the bearing 482b. The ball spline 482 can perform rectilinear motion while restricting torque (rotating force) by causing the balls 482d to circulate or roll.

As shown in FIG. 2, the ball screw 484 transforms the rotary motion of the first shaft 480 into a helical motion including a rectilinear motion and the rotary motion and transmits the helical motion to the chuck device 42 via the second shaft 486. The ball screw 484 includes the threaded shaft 484a, a nut 484b, and balls (not shown). In the ball screw 484, the balls roll between the threaded shaft 484a and the nut 484b and so high efficiency can be obtained.

As the first shaft 480 rotates, the threaded shaft 484*a* rotates. The nut 484*b* is secured to the second portion 452 of the rod 45. Therefore, as the first shaft 480 rotates, the threaded shaft 484*a* produces helical motion. In this way, the ball screw 484 transforms the rotary motion of the first shaft 480 into helical motion. The threaded shaft 484*a* of the ball screw 484 is connected to the second shaft 486.

As the threaded shaft 484*a* effects helical motion, the second shaft 486 also performs helical motion. The second shaft 486 transmits the helical motion of the threaded shaft 484*a* to the chuck device 42. The second shaft 486 has a front end to which a bearing 487 is mounted. Since the threaded shaft 484*a* performs helical motion, the second shaft 486 causes rotary motion in addition to rectilinear motion. Because the bearing 487 is mounted to the front end of the second shaft 486, only the rectilinear motion of the second shaft 486 is transmitted to the chuck device 42; rotary motion is not transmitted.

The first shaft 480, the splined shaft 482*a*, the threaded shaft 484*a*, and the second shaft 486 have their respective central axes located on the same axis A which is parallel to the Z-axis. For example, the axis A coincides with the central axis of the rod 45.

The resilient member 488 is connected to the splined shaft 482*a*. The resilient member 488 may be connected to the splined shaft 482*a* via the first shaft 480. The resilient member 488 is located behind the bearing 482*b*. When a force in the Z direction is applied to the splined shaft 482*a*, i.e., a force along the axis A is applied to the splined shaft 482*a*, the resilient member 488 elastically deforms.

The resilient member 488 is a compression coil spring that sustains a compressive load, for example. In the illustrated example, the first shaft 480 passes through the compression coil spring. If the resilient member 488 elastically deforms when a force in the Z direction is applied to the splined shaft 482*a*, the resilient member 488 is not restricted to a compression coil spring.

Figure 4:
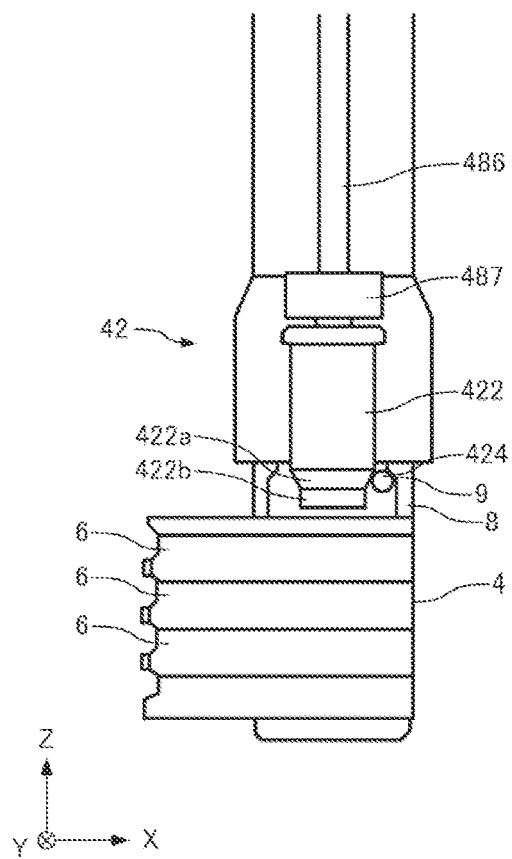
FIGS. 4-7 illustrate a chuck device.
Figure 5:
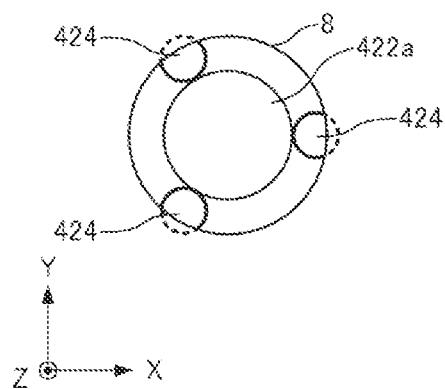
Figure 6:
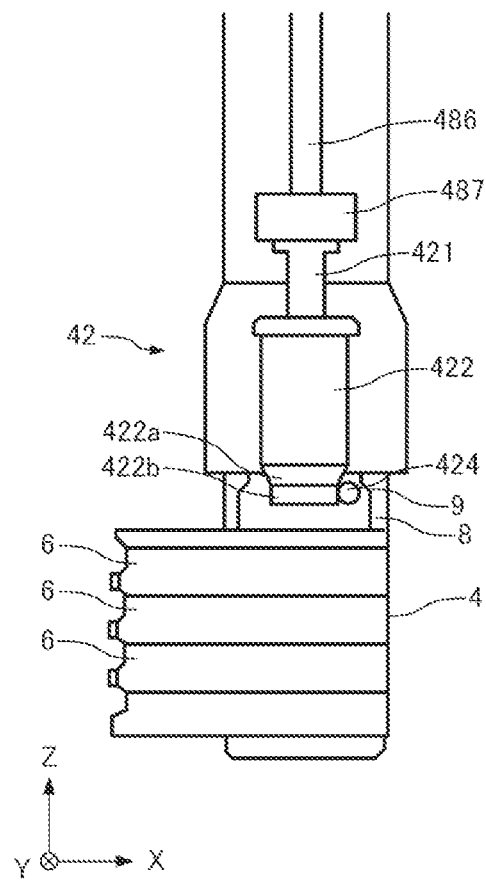
Figure 7:
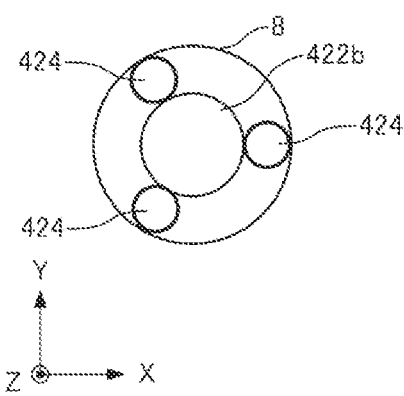

FIGS. 4-7 illustrate the chuck device 42. FIGS. 4 and 5 illustrate a state in which the magazine 4 is gripped by the chuck device 42. FIGS. 6 and 7 illustrate a state in which the magazine 4 is released by the chuck device 42. FIGS. 5 and 7 are views of the chuck device 42 as taken from the Z direction.

As shown in FIGS. 4-7, the chuck device 42 includes a shaft 421, a shaft member 422, and balls 424. As shown in these figures, the shaft member 422 has a first portion 422*a* and a second portion 422*b* of a smaller diameter than the first portion 422*a*. The second portion 422*b* is located closer to the front end of the shaft member 422 than is the first portion 422*a*, i.e., located more forwardly of the front end of the shaft member 422 in the –Z direction. Three balls 424 are attached to the shaft member 422.

The shaft 421 is connected to the shaft member 422. By moving the shaft 421 in the –Z direction, the shaft member 422 moves in the –Z direction. Similarly, by moving the shaft 421 in the +Z direction, the shaft member 422 moves in the +Z direction.

By moving the shaft 421 in the –Z direction, the three balls 424 are brought into contact with the first portion 422*a* as shown in FIGS. 4 and 5. By moving the shaft 421 in the +Z direction, the three balls 424 are brought into contact with the second portion 422*b* as shown in FIGS. 6 and 7.

As mentioned previously, the second portion 422*b* is of a smaller diameter than the first portion 422*a* and so when the three balls 424 are in contact with the second portion 422*b*, the adjacent balls 424 are spaced more closely than when the three balls 424 are in contact with the first portion 422*a*.

Accordingly, when the three balls 424 are in contact with the second portion 422*b*, a circle interconnecting the three balls 424 has a diameter smaller than when the three balls 424 are in contact with the first portion 422*a*.

The magazine 4 has a top portion provided with a cylindrical mounting portion 8. The shaft member 422 is inserted from the top opening of the mounting portion 8. The top opening of the mounting portion 8 has a diameter smaller than the inside diameter of the mounting portion 8. Therefore, a step portion 9 is formed inside the mounting portion 8.

Where the chuck device 42 grips and locks the magazine 4, the chuck device 42 is moved into contact with the magazine 4 and then the shaft member 422 and the balls 424 are pushed into the opening of the mounting portion 8 of the magazine 4. At this time, the three balls 424 are in a state where they are in contact with the second portion 422*b* as shown in FIGS. 6 and 7.

Then, the shaft member 422 is moved in the –Z direction. Consequently, as shown in FIGS. 4 and 5, the three balls 424 come into contact with the first portion 422*a*, increasing the spacing between the adjacent balls 424. As a consequence, the balls 424 are caught on the step portion 9 and thus the magazine 4 is secured.

Where the chuck device 42 releases the magazine 4, the shaft member 422 is moved in the +Z direction from the state where the magazine 4 is gripped by the chuck device 42. Consequently, as shown in FIGS. 6 and 7, the three balls 424 come into contact with the second portion 422*b*, reducing the spacing between the adjacent balls 424. As a result, the three balls 424 are not caught on the step portion 9. Hence, the magazine 4 is unlocked and released from the chuck device 42.

2. Operation 2.1. Power Transmission Mechanism

Figure 8:
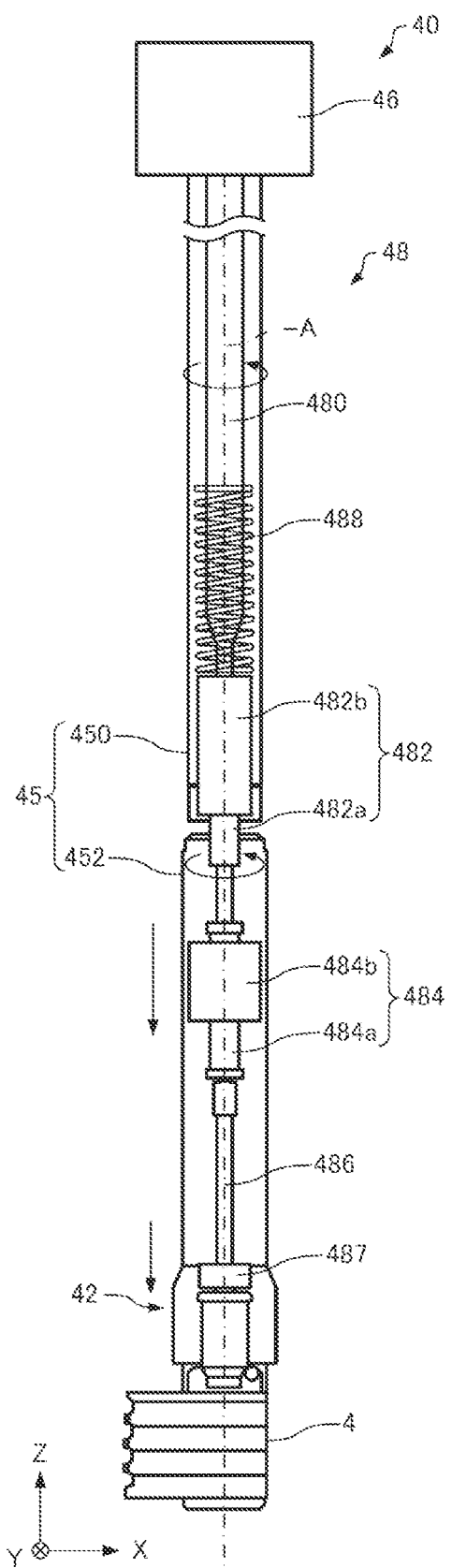
FIGS. 8 and 9 illustrate the operation of a power transmission mechanism.
Figure 9:
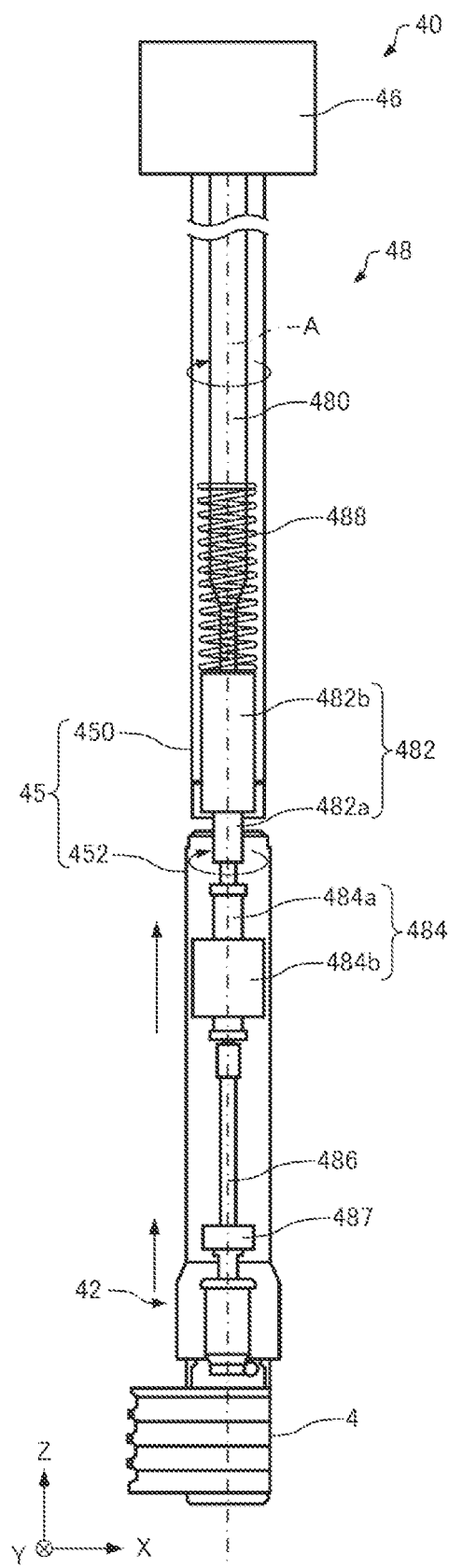

FIGS. 8 and 9 illustrate the operation of the power transmission mechanism 48. FIG. 8 shows a state in which the magazine 4 is gripped by the chuck device 42. FIG. 9 shows a state in which the magazine 4 is released from the chuck device 42.

When the mechanical driver 46 rotates the first shaft 480 counterclockwise as shown in FIG. 8, the threaded shaft 484*a* moves helically counterclockwise, thus stretching the threaded shaft 484*a* in the –Z direction. As a result, the second shaft 486 moves in the –Z direction. As shown in FIG. 4, as the second shaft 486 moves in the –Z direction, the shaft member 422 moves in the –Z direction, securing the magazine 4.

When the mechanical driver 46 rotates the first shaft 480 clockwise as shown in FIG. 9, the threaded shaft 484*a* moves helically clockwise and becomes elongated in the +Z direction. As a result, the second shaft 486 moves in the +Z direction. As the second shaft 486 moves in the +Z direction as shown in FIG. 6, the shaft member 422 moves in the +Z direction, unlocking the magazine 4. The chuck device 42 releases the magazine 4.

2.2. Resilient Member

Figure 10:
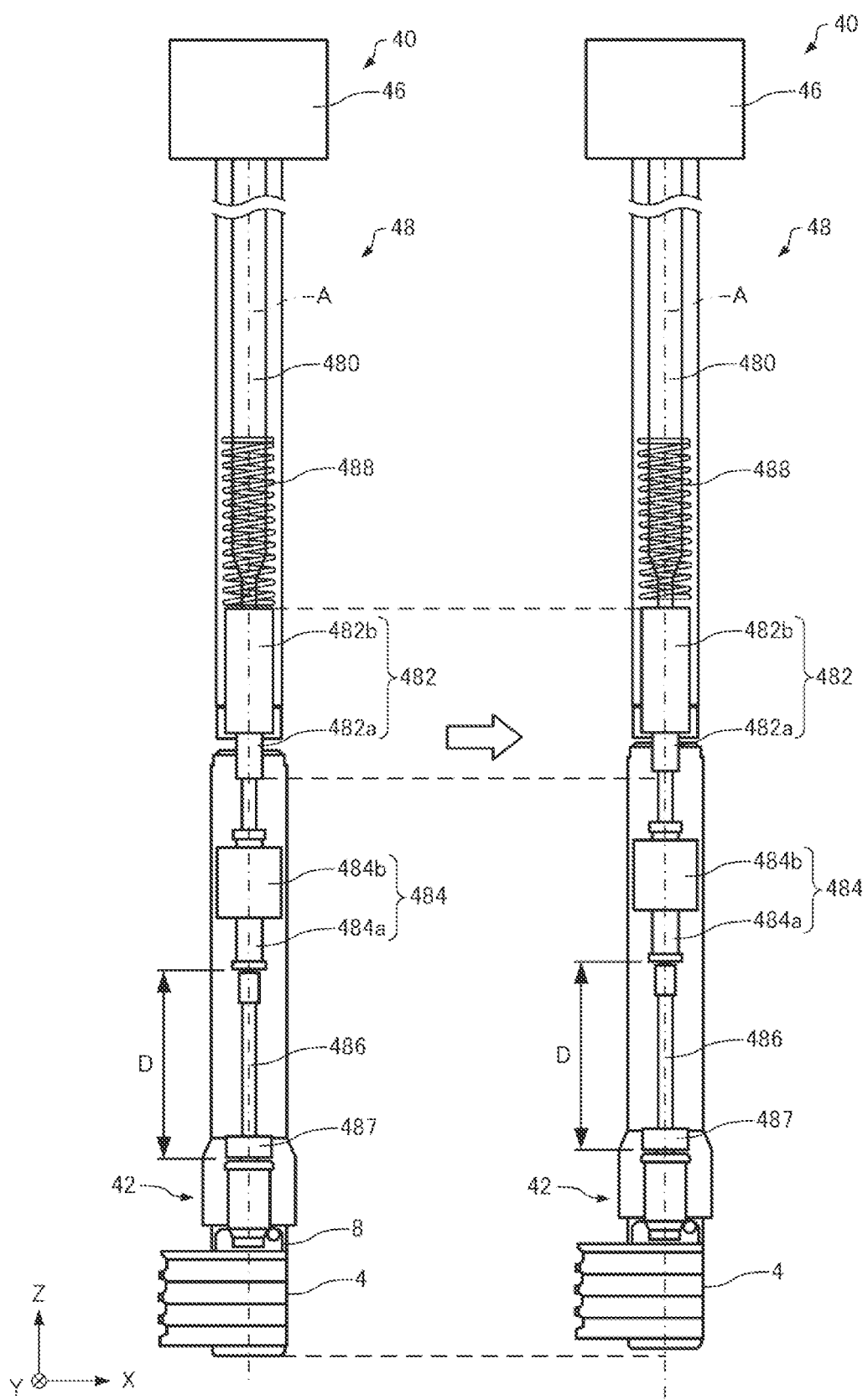
FIG. 10 illustrates the function of a resilient member.

FIG. 10 illustrates the function of the resilient member 488. The resilient member 488 moves the chuck device 42 into the sample container 2 with the drive mechanism 44 and reduces the force produced when the chuck device 42 contacts the magazine 4. For example, if the power transmission mechanism 48 does not include the resilient member 488, and if the chuck device 42 contacts the magazine 4, the sample container 2 will be pushed in, resulting in a vacuum leak from the vacuum seal 38.

If the shaft member 422 and the balls 424 are pushed into the opening of the mounting portion 8 of the magazine 4 as shown in FIG. 4 in order to grip the magazine 4 with the chuck device 42, the second shaft 486 and the ball screw 484 (threaded shaft 484a and the nut 484b) move in the +Z direction as shown in FIG. 10. Because the nut 484b is secured to the second portion 452 of the rod 45, the second portion 452 also moves in the +Z direction.

Because the ball screw 484 moves in the +Z direction, the splined shaft 482a of the ball spline 482 moves in the +Z direction. At this time, the resilient member 488 connected to the splined shaft 482a elastically deforms. In particular, the resilient member 488 is compressed along the Z-axis and then returns to its original shape. When the shaft member 422 of the chuck device 42 and the balls 424 are pushed into the opening of the mounting portion 8 of the magazine 4, the force applied to the magazine 4 can be reduced by the elastic deformation of the resilient member 488.

The ball spline 482 can perform rectilinear motion while restricting the torque as described above. Therefore, when a force in the Z direction is applied to the chuck device 42, the ball spline 482 can move in the Z direction as mentioned previously.

If a force in the Z direction is applied to the shaft member 422 of the chuck device 42, the chuck device 42 keeps gripping the magazine 4. Since the first transport device 40 includes the ball screw 484, if a force in the Z direction is applied to the shaft member 422 of the chuck device 42, the distance D between the front end of the threaded shaft 484a and the front end of the shaft 421 of the chuck device 42 does not vary. Consequently, if a force in the Z direction is applied to the shaft member 422 of the chuck device 42, the chuck device 42 can keep gripping the magazine 4.

In the chuck device 42, the threaded shaft 484a must be rotated in order to vary the distance D. If a force in the Z direction is applied to the shaft member 422 of the chuck device 42, the threaded shaft 484a does not rotate and so the gripping of the magazine 4 can be maintained.

In the foregoing description, a case has been presented in which a force in the Z direction is applied to the shaft member 422 while the chuck device 42 is gripping the magazine 4. The same principle also applies to a case where a force in the Z direction is applied to the shaft member 422 while the chuck device 42 is releasing the magazine 4 as shown in FIG. 6. That is, if a force in the Z direction is applied to the shaft member 422 of the chuck device 42 while the chuck device 42 is releasing the magazine 4, the release of the magazine 4 by the chuck device 42 is maintained.

2.3. Operation of Electron Microscope 2.3.1. Attachment of Cartridge

FIGS. 11-14 illustrate the operation of the electron microscope 100. In the electron microscope 100, the selected cartridge 6 received in the sample container 2 can be automatically transported into the sample chamber 10 and attached to the mounting portion 22 of the sample holder 20.

Figure 11:
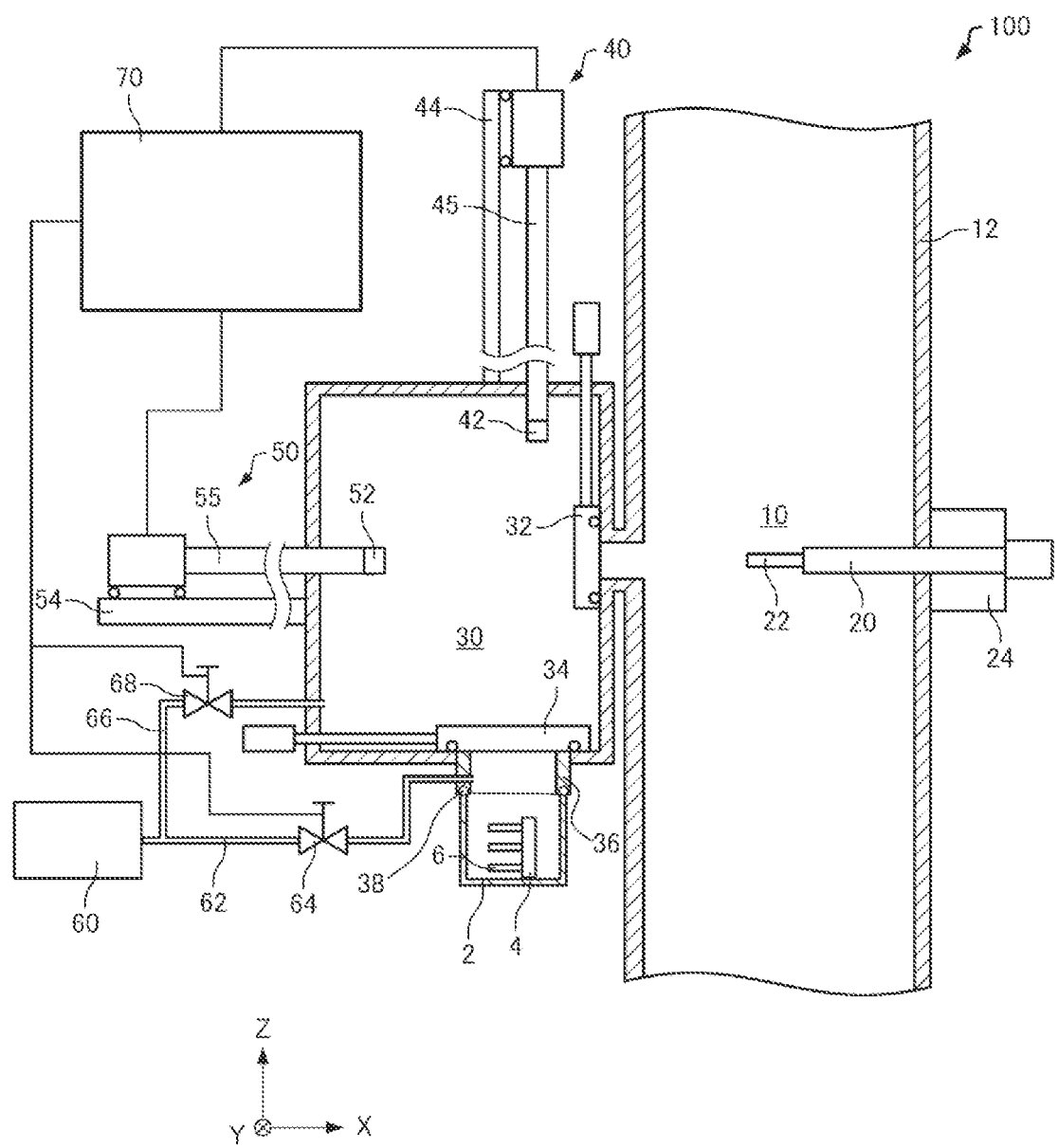
FIGS. 11-14 are diagrams illustrating the operation of the electron microscope of FIG. 1.

The cartridge 6 loaded in the magazine 4 is received in the sample container 2, which in turn is mounted to the connective member 36 as shown in FIG. 11. At this time, the partition valve 34 is closed. The user enters an instruction to the controller 70 to introduce the cartridge 6.

Figure 12:
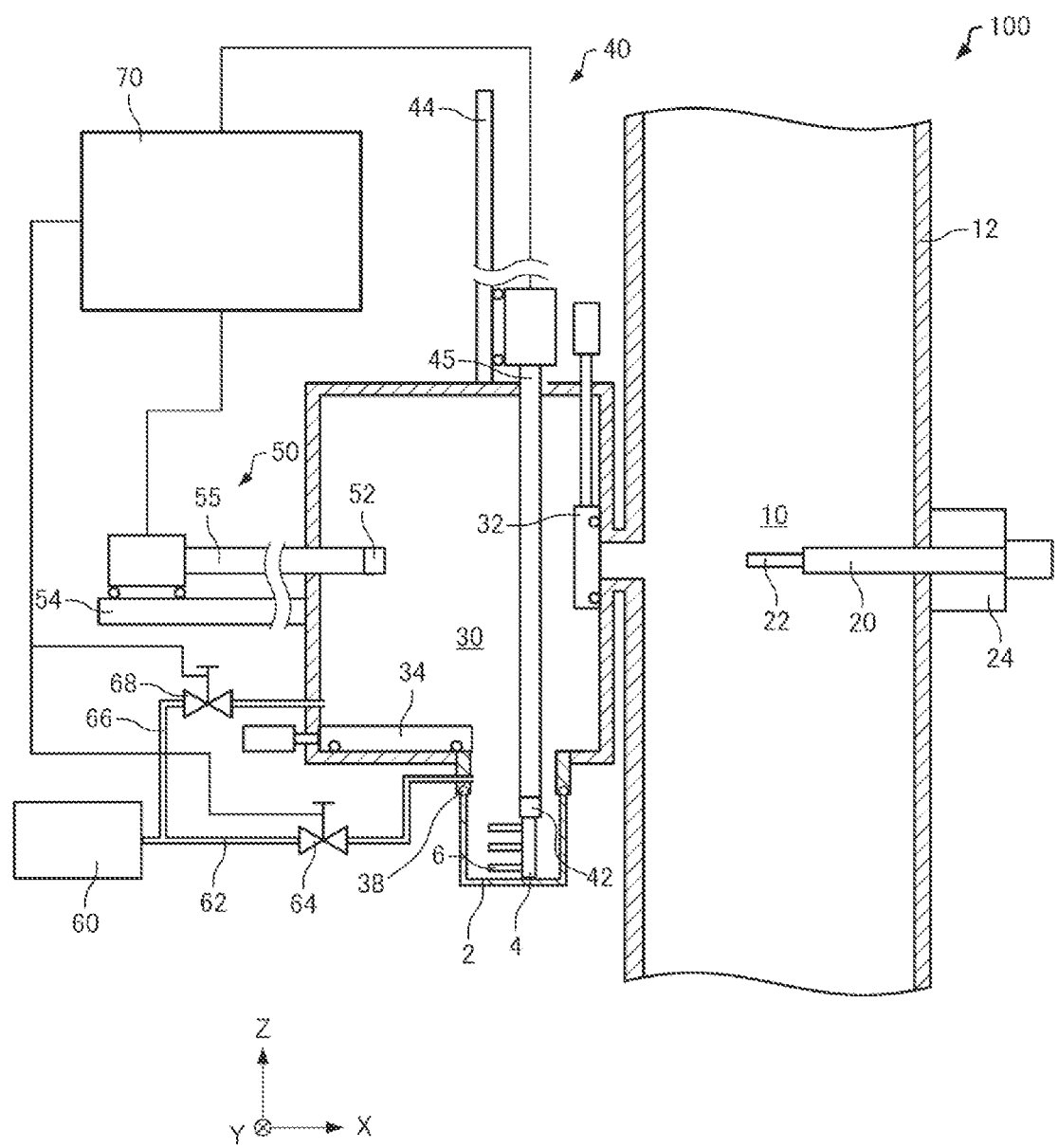

Upon receiving the instruction for introducing the cartridge 6, the controller 70 opens the solenoid valve 64 and evacuates the interior of the sample container 2 to a vacuum. When the interior of the sample container 2 becomes below a given pressure, the controller 70 opens the partition valve 34 as shown in FIG. 12.

The controller 70 then moves the chuck device 42 into the sample container 2 and causes the chuck device 42 to grip the magazine 4. In particular, the chuck device 42 is first moved in the −Z direction using the drive mechanism 44 and brought into contact with the magazine 4 in the sample container 2. The chuck device 42 is then moved further in the −Z direction with the drive mechanism 44, and the shaft member 422 and the balls 424 are pushed into the opening of the mounting portion 8 of the magazine 4. Then, the mechanical driver 46 is operated to move the shaft member 422 in the −Z direction. Consequently, as shown in FIGS. 4 and 5, the spacing between the three balls 424 increases, securing the magazine 4. As a result, the magazine 4 can be gripped by the chuck device 42.

When the chuck device 42 is moved in the −Z direction and the shaft member 422 and the balls 424 are pushed into the opening of the mounting portion 8 of the magazine 4 as described above, a force in the −Z direction is applied to the magazine 4. However, in the electron microscope 100, as shown in FIG. 10, the resilient member 488 elastically deforms to thereby reduce the force applied to the magazine 4. Accordingly, if a force in the −Z direction, for example, is applied to the magazine 4, a force in the −Z direction will be applied to the sample container 2. As a result, a gap would normally be created between the sample container 2 and the connective member 36, causing inflow of air into the sample container 2.

Figure 13:
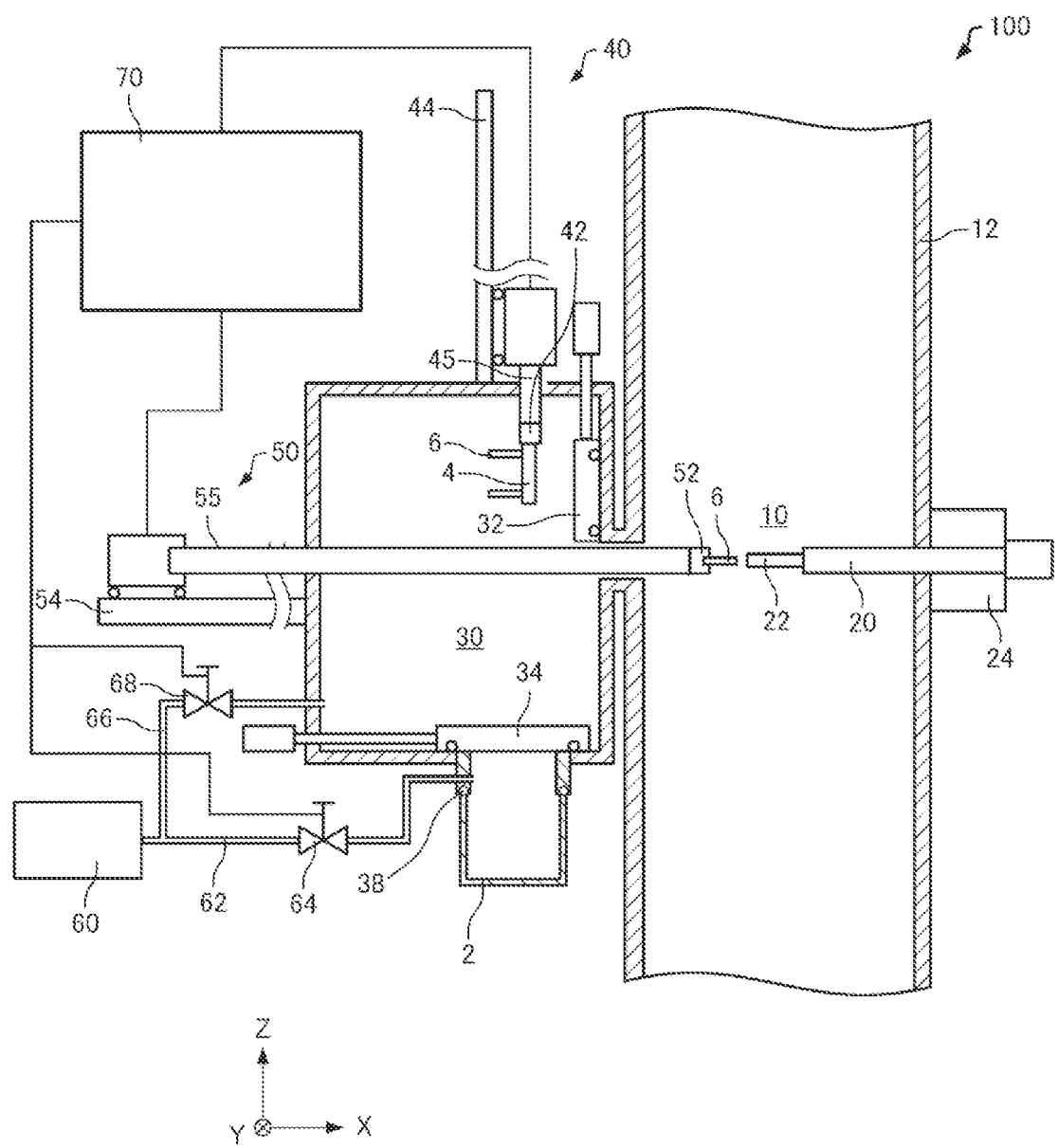

Then, as shown in FIG. 13, the chuck device 42 gripping the magazine 4 is transported into the sample exchange chamber 30, then the partition valve 34 is closed, and the partition valve 32 is opened under control of the controller 70. The chuck device 52 grips the specified cartridge 6 from within the magazine 4 gripped by the chuck device 42, the chuck device 52 having the gripped cartridge 6 is transported into the sample chamber 10, and the cartridge 6 is mounted to the mounting portion 22 also under control of the controller 70.

Figure 14:
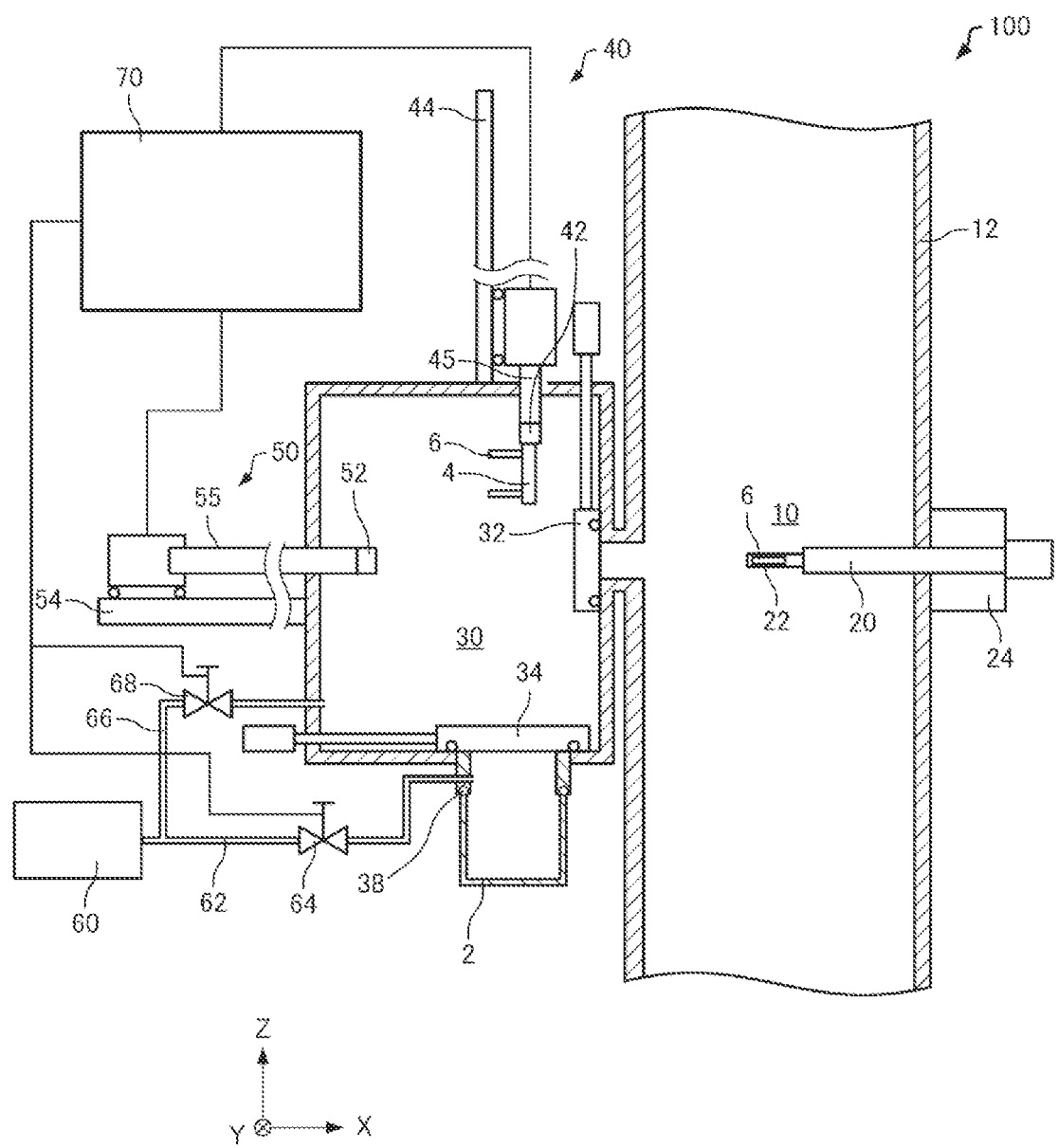

Then, as shown in FIG. 14, the controller 70 returns the chuck device 52 into the sample exchange chamber 30 and closes the partition valve 32. Because of the processing steps described so far, the cartridge 6 can be mounted to the sample holder 20. Consequently, the sample held in the cartridge 6 can be observed with the electron microscope 100.

2.3.2. Detachment of Cartridge

In the electron microscope 100, the cartridge 6 can be automatically taken out from the mounting portion 22 of the sample holder 20 and carried into the sample exchange chamber 30. Furthermore, in the electron microscope 100, the magazine 4 can be automatically returned from the sample exchange chamber 30 to the sample container 2.

As shown in FIG. 13, the controller 70 opens the partition valve 32 and moves the chuck device 52 into the sample chamber 10. Then, as shown in FIG. 12, the controller 70 causes the chuck device 52 to grip the cartridge 6 mounted to the mounting portion 22 and carries the cartridge 6 into the sample exchange chamber 30. Then, the controller 70 closes the partition valve 32. Subsequently, the controller 70 inserts the cartridge 6 gripped by the chuck device 52 into the magazine 4 gripped by the chuck device 42.

The controller 70 opens the partition valve 34, moves the chuck device 42 gripped by the magazine 4 into the sample container 2, and puts the magazine 4 into the sample container 2. The controller 70 operates the mechanical driver 46 to move the shaft member 422 in the +Z direction. Consequently, as shown in FIG. 6, the spacing between the three balls 424 decreases, thus releasing the magazine 4.

The controller 70 moves the chuck device 42 in the +Z direction back into the sample exchange chamber 30 as shown in FIG. hand closes the partition valve 32. Because of the processing steps described so far, the magazine 4 can be returned into the sample exchange chamber 30.

3. Functions and Effects

In the electron microscope 100, the first transport device 40 includes the chuck device 42 for gripping the cartridge 6 in the sample container 2, the drive mechanism 44 for moving the chuck device 42 in the Z direction, the mechanical driver 46 for actuating the chuck device 42, and the power transmission mechanism 48 for transmitting power from the mechanical driver 46 to the chuck device 42. The power transmission mechanism 48 includes the splined shaft 482a and the resilient member 488 that elastically deforms when a force in the Z direction is applied to the splined shaft 482a.

In this way, the electron microscope 100 includes the resilient member 488 which, when a force in the Z direction is applied to the splined shaft 482a, undergoes elastic deformation. Therefore, when the chuck device 42 grips the magazine 4, the force applied to the magazine 4 can be decreased. For this reason, when the chuck device 42 grips the magazine 4, the force applied to the sample container 2 via the magazine 4 can be reduced. In consequence, inflow of air into the sample container 2 can be prevented; otherwise, the sample may become frosted during cooling of the sample, making it impossible to observe the original shape of the sample.

In the electron microscope 100, the power transmission mechanism 48 includes the ball spline 482 for restricting rotary motion of the mechanical driver 46 and the ball screw 484 for transforming the rotary motion transmitted from the first shaft 480 into a helical motion including a rectilinear motion and the rotary motion. The chuck device 42 is operated by the helical motion transmitted from the ball screw 484. Therefore, in the electron microscope 100, if the chuck device 42 is pushed against the magazine 4 and the power transmission mechanism 48 moves in the Z direction, the distance D between the front end of the threaded shaft 484a and the front end of the shaft 421 of the chuck device 42 does not vary. Accordingly, when the chuck device 42 is gripping the magazine 4, if an impact is applied to the chuck device 42, the gripping of the magazine 4 can be maintained. Similarly, when the chuck device 42 unlocks and releases the magazine 4, if an impact is applied to the chuck device 42, the releasing of the magazine 4 can be maintained.

In the electron microscope 100, the resilient member 488 is connected to the splined shaft 482a of the ball spline 482 and elastically deforms when a force in the Z direction is applied to the splined shaft 482a. The ball spline 482 can perform a rectilinear motion while restricting the torque. Therefore, when a force in the Z direction is applied to the shaft member 422 of the chuck device 42 as described above, the splined shaft 482a can be moved in the Z direction.

4. Modified Embodiments

In the foregoing embodiment, the charged particle beam system associated with the present invention has been described in which an electron microscope for observing or analyzing a sample using an electron beam is taken as an example. The charged particle beam system associated with the present invention may also be an instrument for making an observation or analysis of a sample using a charged particle beam other than an electron beam such as an ion beam. For example, the charged particle beam system associated with the present invention may be a scanning transmission electron microscope, a scanning electron microscope, an Auger electron spectrometer, a focused ion beam system, or the like.

It is to be understood that the present invention is not restricted to the above embodiment and modifications thereof and that the invention can be practiced in further modified forms. For example, the present invention embraces configurations substantially identical (e.g., in function, method and results or in purpose and advantageous effects) to the configurations described in the above embodiment. Furthermore, the present invention embraces configurations similar to the configurations described in the above embodiment except that nonessential portions have been replaced. In addition, the present invention embraces configurations identical in advantageous effects or purpose to the configurations described in the above embodiment. Further, the present invention embraces configurations similar to the configurations described in the above embodiment except that a well-known technique is added.

What is claimed is:

1. A charged particle beam system comprising:
a sample chamber;
a sample exchange chamber connected to the sample chamber;
a sample container capable of being removably attached in the sample exchange chamber; and
a transport device for transporting a sample between the sample container and the sample exchange chamber;
wherein the transport device comprises a chuck device for gripping the sample, a drive mechanism for moving the chuck device in a given direction, a mechanical driver for actuating the chuck device, and a power transmission mechanism for transmitting power of the mechanical driver to the chuck device; and
wherein the power transmission mechanism comprises a shaft and a resilient member that elastically deforms when a force in the given direction is applied to the shaft.

2. The charged particle beam system as set forth in claim 1, wherein said power transmission mechanism comprises a ball spline for restricting rotary motion of said mechanical driver and a ball screw for transforming the rotary motion transmitted from said shaft into a helical motion comprising a rectilinear motion and the rotary motion, and wherein said chuck device is operated by the helical motion transmitted from the ball screw.

3. The charged particle beam system as set forth in claim 2, wherein
said ball screw comprises a threaded shaft,
said shaft transmits the rotary motion to the threaded shaft, and
the threaded shaft is caused to perform helical motion by the rotary motion of the shaft.

4. The charged particle beam system as set forth in claim 1, wherein said mechanical driver is disposed outside said sample exchange chamber.

5. The charged particle beam system as set forth in claim 1, further comprising a vacuum seal mounted between said sample exchange chamber and said sample container.

* * * * *